United States Patent [19]
Aoki et al.

[11] Patent Number: 4,755,394
[45] Date of Patent: Jul. 5, 1988

[54] ELECTROCONDUCTIVE ARTICLES AND A METHOD OF PRODUCING THE SAME

[75] Inventors: Masami Aoki, Higashimurayama; Takashi Kitamura, Hachioji; Takashi Ohashi, Iruma, all of Japan

[73] Assignee: Bridgestone Corporation, Tokyo, Japan

[21] Appl. No.: 7,695

[22] Filed: Jan. 28, 1987

Related U.S. Application Data

[62] Division of Ser. No. 720,938, Apr. 8, 1985, abandoned.

[30] Foreign Application Priority Data

Apr. 6, 1984 [JP] Japan ................................ 59-67463
Nov. 9, 1984 [JP] Japan ............................... 59-236379

[51] Int. Cl.$^4$ ............................................... B05D 5/12
[52] U.S. Cl. .................................... 427/123; 427/305; 427/306; 428/423.1; 428/461; 428/463; 428/698
[58] Field of Search ........................ 427/305, 306, 123; 428/461, 458, 463, 698, 423.1

[56] References Cited

U.S. PATENT DOCUMENTS 4,309,454 1/1982 Feldstein .............................. 427/97
4,513,057 4/1985 Peters .................................. 427/336

FOREIGN PATENT DOCUMENTS 35406 9/1981 European Pat. Off. .
86072 8/1983 European Pat. Off. .

Primary Examiner—Edith Buffalow
Attorney, Agent, or Firm—Sughrue, Mion, Zinn, Macpeak, and Seas

[57] ABSTRACT

An electroconductive article is disclosed, which comprises a polar group-containing high polymeric substrate, and an electroconductive layer of cupric sulfide formed therein and is produced by immersing the polar group-containing high polymeric substrate in an aqueous solution containing a bivalent copper compound and a reducing agent or an aqueous solution containing a monovalent copper compound, and at the same time or subsequently treating it in a solution of a sulfur releasable substance.

12 Claims, No Drawings

ELECTROCONDUCTIVE ARTICLES AND A METHOD OF PRODUCING THE SAME

This application is a divisional of Ser. No. 720,938, filed Apr. 8, 1985, now abandoned.

BACKGROUND OF THE INVENTION

1. Field of the Invention;

This invention relates to electroconductive articles and a method of producing the same.

2. Description of the Prior Art;

As an electroconductive polymer material, there have hitherto been known fibers, films and so on obtained by adhering cuprous sulfide as an electroconductive layer to high molecular weight substances having a nitrile group such as acrylic fibers, acrylic films and the like. These materials are produced by utilizing coordinate bond of monovalent copper ion to nitrile group as a copper dyeing process in a dyeing chemistry. In this case, cuprous sulfide ($Cu_2S$) of the electroconductive layer actually has a composition of $Cu_xS$ ($1.75 \leq x < 2$) slightly deviated from stoichiometric quantity and is reported to exhibit a behavior of P-type semiconductor. However, the electroconductive articles comprising cuprous sulfide as the electroconductive layer are not yet satisfactory in view of electroconductivity.

On the other hand, it is known that cupric sulfide (CuS) exhibits an electroconductivity higher by at least a figure than that of cuprous sulfide ($Cu_xS$, $1.75 \leq x < 2$). However, bivalent copper ion is poor in the coordination ability to the functional group of the polymer material as compared with monovalent copper ion, so that it is very difficult to produce electroconductive articles containing cupric sulfide as the electroconductive layer.

SUMMARY OF THE INVENTION

The inventors have made various studies with respect to electroconductive articles utilizing the electroconductivity of cupric sulfide and found that electroconductive articles having a high electroconductivity can be produced by treating a high polymeric substrate provided with cuprous sulfide as an electroconductive layer in a solution of a sulfur releasable substance to convert a greater part of the electroconductive layer into cupric sulfide without damaging the adhesion performance of the electroconductive layer to the high polymeric substrate, and as a result the invention has been accomplished.

According to a first aspect of the invention, there is the provision of an electroconductive article comprising a polar group-containing high polymeric substrate, and an electroconductive layer of cupric sulfide formed therein.

According to a second aspect of the invention, there is the provision of a method of producing an electroconductive article, comprising immersing a polar group-containing high polymeric substrate in an aqueous solution containing a bivalent copper compound and a reducing agent or an aqueous solution containing a monovalent copper compound, and at the same time or subsequently treating it in a solution of a sulfur releasable substance.

DETAILED DESCRIPTION OF THE INVENTION

As the polar group-containing high polymeric substrate according to the invention, mention may be made of high molecular weight substances containing the polar group selected from nitrile group, urethane group, urea group, amido group, hydroxyl group, ether group, ester group and the like, which include nitrile group-containing polymers, polyvinyl chloride containing polyurethanes, polyamides, polyesters, polyethers, polyvinyl alcohols and so on.

As the nitrile group containing polymer, use may be made of acrylic fibers, nitrile group-containing polyurethane foams (polyurethane foam containing polyol grafted with acrylonitrile and so on) and acrylonitrile; methacrylonitrile; ethacrylonitrile; derivatives of α-substituted acrylonitrile such as α-propyl acrylonitrile and the like; vinylidene cyanide; homopolymers of a compound containing at least one nitrile group in its molecule such as α-methylene glutaronitrile or the like; copolymers of the nitrile group-containing compound with a copolymerizable unsaturated vinyl compound (for example, acrylic acid, methacrylic acid or an ester thereof; acrylamide; vinyl acetate; vinyl chloride; vinylidene chloride; vinylsulfonic acid; methallyl sulfonic acid, p-styrene sulfonic acid or a salt thereof; dimethyl or diethyl aminoethyl ester of acrylic or methacrylic acid; N-substituted aminopropyl esters; N-substituted aminobutyl esters; vinylpyridine and the like) and so on.

The polyvinyl chloride containing polyurethane foams are generally known as a foam of a grade having flame retardant properties and may easily be produced or be available in the market. As such a foam, mention may be made of polyurethane foams containing 2 to 100 parts by weight, preferably 5 to 40 parts by weight of finely divided polyvinyl chloride based on 100 parts by weight of polyol, an example of which is a flexible polyurethane foam containing polyvinyl chloride, zinc oxide and antimony trioxide. When the content of polyvinyl chloride is less than 2 parts by weight, the adhesion of copper sulfide is insufficient and it is difficult to obtain practical electroconductivity, while when it exceeds 100 parts by weight, the effect of improving the electroconductivity is saturated and the viscosity of the mixed liquid consisting mainly of polyol increases to make good foaming difficult and also the properties of the resulting foam are degraded. This polyurethane foam according to the invention can easily be produced by compounding polyvinyl chloride dispersed polyol with polyisocyanate, foaming agent, catalyst, foam stabilizer and other additives and then foaming it.

The shape of the polar group-containing high polymeric substrate (hereinafter referred to as a polymer substrate) is not critical and may take fiber, film, foam, powder, sheet or the like.

According to the invention, an electroconductive layer of a cuprous compound is first formed in the polymer substrate by immersing the polymer substrate in an aqueous solution containing a bivalent copper compound and a reducing agent or an aqueous solution containing a monovalent copper compound. In this case, it is preferable that the immersion treatment is carried out by gradually heating from room temperature to a temperature of 50°–120° C. Moreover, the immersion time is dependent upon the concentration of the copper compound used and the treating temperature, but it is required to be about 90 minutes for obtaining good adhesion of copper compound when the polymer substrate is immersed, for example, in an aqueous solution having a concentration of cuprous chloride of 0.4 mol/l at 60° C.

As the monovalent copper compound, mention may be made of cuprous chloride, cuprous iodide, cuprous cyanide, cuprous thiocyanate and the like. As the bivalent copper compound, mention may be made of cupric sulfate, cupric chloride, cupric nitrate, cupric acetate, cupric oxalate and the like. As the reducing agent, mention may be made of metallic copper, ferrous sulfate, sodium hypophosphite, hydroxylamine or a salt thereof, ammonium vanadate, furfural, glucose and the like.

In case of using the monovalent copper compound, a dissolving aid such as hydrochloric acid, ammonium chloride or the like may be added, if necessary. Moreover, in the aqueous solution containing the cupric copper compound and the reducing agent, cupric ion is reduced to cuprous ion at 90°–120° C. under a condition of pH=1.5–4.0, whereby the resulting cuprous ion is bonded by corrdination to the polar group of the polymer substrate. In order to efficiently enhance the adhesion of the cuprous compound to the polymer substrate, it is favorable that the surface of the polymer substrate is previously roughened by treating with an aqueous alkali solution or by removing cell membranes from the foam as the substrate according to explosive process and then treating with the aqeuous alkali solution.

The amount of the cuprous compound adhered to the polymer substrate is not less than 1% by weight, preferably not less than 3% by weight.

According to the invention, the thus treated polymer substrate is treated in a solution of a sulfur releasable substance during or after the above immersion treatment, whereby sulfurization reaction is caused to convert the cuprous compound into cupric sulfide. In this case, the concentration (by molar ratio) of sulfur in the solution is not more than 3 times, preferably not more than 2 times the concentration of the cuprous compound. Most preferably, the molar ratio of the sulfur concentration to the cuprous ion concentration is 1:1.

The term "sulfur releasable substance" used herein means substances capable of releasing sulfur atom and-/or sulfur ion, an example of which includes elemental sulfur, sodium thiosulfate, sodium sulfide, sodium hydrogensulfite, sulfurous acid, sodium dithionite, dithionous acid, Rongalit (trade name), ammonium sulfide, potassium sulfide, ammonium polysulfide, sodium polysulfide, potassium polysulfide, sulfur dioxide, hydrogen sulfide and the like.

As the solution of sulfur releasable substance, there is used a solution of elemental sulfur in benzene, toluene, xylene, ether, alcohol or the like. In this case, an amine for generating free sulfur from the sulfur solution, such as n-butylamine, ethanolamine, morpholine, ethylenediamine, piperidine or the like may be added to promote sulfurization reaction. In the sulfur solution, the concentration of sulfur is within a range of 0.5–3% by weight, and the concentration of amine is within a range of 0.1–3% by weight.

In addition to the sulfur solution, an aqueous solution of the sulfur releasable substance such as ammonium sulfide, sodium sulfide, potassium sulfide, ammonium polysulfide, sodium polysulfide, potassium polysulfide or the like may also be used. In this case, the concentration of such a sulfur releasable substance is preferable within a range of 2–20% by weight.

Furthermore, an aqueous solution obtained by blowing a sulfur-containing gas such as sulfur dioxide, hydrogen sulfide or the like into water may be used as the solution of the sulfur releasable substance.

According to the invention, the sulfurization treatment with the solution of sulfur releasable substance is carried out at a temperature above room temperature, preferably at a temperature of 50°–120° C. For example, when the treating temperature is 60° C., the treating time is suitable to be about 90 minutes. As the treating temperature rises, the treating time is shortened, but when the treating temperature exceeds 120° C., the strength of the resulting electroconductive article unfavorably lowers. Moreover, the treating time can be shortened by irradiating ultraviolet ray, electron radiation, $\gamma$-ray or the like to the solution of sulfur releasable substance. Particularly, when the polyvinyl chloride containing polyurethane foam is used as the polymer substrate, the adhesion of cupric sulfide is higher than the case of using the polymer substrate other than the above polyurethane foam even if the sulfurization treatment is carried out at the same temperature for the same time, and the electroconductivity is largely improved.

In the electroconductive article according to the invention, the amount of cupric sulfide adhered to the polymer substrate is not less than 1% by weight, preferably 3 to 30% by weight. When the amount of cupric sulfide is less than 1% by weight, the desired electroconductivity can not be obtained, while when it exceeds 30% by weight, the electroconductivity is substantially saturated and the properties of the article such as strength, flexibility and the like are unfavorably deteriorated.

According to the invention, it is preferable that the cuprous compound as the electroconductive layer is completely changed into cupric sulfide by the sulfurization treatment because the electroconductivity of the resulting article is highest. However, when at least 20% of the cuprous compound is converted into the cupric compound, the electroconductivity is at least 2 times that of the electroconductive layer composed of only the cuprous compound, which can sufficiently be put into practical use.

The electroconductive articles according to the invention are widely used for various applications, for example, wall covering, ceiling, floor covering and the like in dark room as a radio wave absorbing material; gasket and the like in office supplies and OA supplies as an electromagnetic wave shielding material; molded laminate with unsaturated polyester resin in a parabolic antena as a radio wave reflecting material; sheet heating resistance element, tape-like heating resistance element and the like as a heating resistor; foam for the prevention of static fault as a material in the field of static electricity; static shielding material in the field of electron material; conductive mat for collector; electroflooring mat, sleeping mat, mattress, small size mat for hot compress and the like as a material for low frequency or static treatment, and so on. Particularly, when the polyvinyl chloride containing polyurethane foam is used as the polymer substrate, the copper sulfide is absorbed by the foam in a uniformly dispersed state, so that the resulting electroconductive article is very excellent in the electroconductivity and still holds the good foam texture, and also the burning speed is considerably slow as compared with the conventional article because of its flame retardant properties, which is suitable for use in interior parts of automobiles.

The following examples are given in illustration of the invention and are not intended as limitations thereof. In these examples, all percentages are by weight unless otherwise stated.

EXAMPLE 1

A woven cloth (thickness : 1.1 mm) obtained by knitting acryl fibers (Sandarlon SS-N ®, made by Nippon Sanmo Senshoku K.K.) into a tortoise-shell form was treated with an aqueous solution containing 1 mol/l of cupric sulfate and 1 mol/l of sodium thiosulfate to form cuprous sulfide as an electroconductive layer. Then, five samples were cut out from this treated cloth at a size of 54 mm in fiber continuing direction and 50 mm in a direction perpendicular thereto. Among them, four samples were subjected to sulfurization treatment under the following conditions, respectively.

Treatment 1: The sample was immersed in a toluene solution of 1% sulfur for 1 day.

Treatment 2: The sample was immersed in a toluene solution of 1% sulfur and 1% of morpholine for 1 day.

Treatment 3: The sample was immersed in a toluene solution of 1% of sulfur and 1% of n-butylamine for 1 day.

Treatment 4: Immediately after the sample was immersed in a toluene solution of 1% of sulfur, it was exposed to ultraviolet ray generated from a high pressure mercury lamp (power: 4 kW, made by Toshiba Corporation) for 30 seconds.

These four samples after the above treatment were thoroughly washed with toluene, dried, coated at both ends in fiber continuing direction with an electroconductive silver paint (Dotite D-550, trade name, made by Fujikura Kasai K.K.) over a width of 2 mm, and left to stand for more than 2 hours, to which was connected a copper electrode, and thereafter the surface resistance of the sample cloth with a side of 50 mm was measured by means of a resistance measuring device. And also, the value of resistance in the non-treated sample was measured. The measured results are shown in the following Table 1. The treated samples turned green or deep green, while the non-treated sample was olive.

TABLE 1

| Sample | Surface resistance Ω | Volume resistivity Ω · cm |
| --- | --- | --- |
| non-treated | 28.3 | 3.11 |
| treatment 1 | 10.5 | 1.16 |
| treatment 2 | 9.5 | 1.05 |
| treatment 3 | 6.6 | 0.73 |
| treatment 4 | 8.6 | 0.95 |

As a result of X-ray diffraction on these samples, the non-treated samples showed diffraction peaks corresponding to $Cu_{1.8}S$ at diffraction angles $2\theta$ of 46.3°, 32.1° and 27.7°, while the treated samples reduced the diffraction peaks of $Cu_{1.8}S$ in the order of the reduction of the resistance and newly showed diffraction peaks corresponding to CuS at $2\theta$ of 47.8°, 31.7° and 29.2°.

EXAMPLE 2

The same four samples as in Example 1 were immersed in an aqueous solution of 5% of ammonium polysulfide under conditions as shown in the following Table 2 and then the surface resistance in fiber continuing direction was measured by the same method as described in Example 1 to obtain results as shown in Table 2.

TABLE 2

| No. | Immersing temperature °C. | Immersing time hr | Surface resistance Ω | Volume resistivity Ω · cm |
| --- | --- | --- | --- | --- |
| 1 | 25 | 0.5 | 11.4 | 1.25 |
| 2 | 25 | 2 | 6.1 | 0.67 |
| 3 | 60 | 0.5 | 4.7 | 0.52 |
| 4 | 60 | 2 | 4.7 | 0.52 |
| non-treated sample | | | 28.3 | 3.11 |

As a result of the measurement of X-ray diffraction of the sample treated under the condition No. 4, the peaks of $Cu_{1.8}S$ near $2\theta$ of 46.3°, 32.1° and 27.7° substantially disappeared, and the peaks of CuS at $2\theta$ of 47.8°, 31.7° and 29.2° clearly appeared.

EXAMPLE 3

To 100 parts by weight of polymer polyol contanaing 20% of acrylonitrile were added 4.4 parts by weight of water, 48.5 parts by weight of TDI-80 (trade name) and given amounts of foam stabilizer and catalyst to produce a nitrile groupcontainig polyurethane foam with a density of 0.025 g/cm$^3$, from which cell membranes were removed by an explosive process. The thus obtained foam was immersed in an aqueous solution of 15% of sodium hydroxide for 30 minutes, washed with water, dried, subjected to a heat treatment in an aqueous solution containing 0.1 mol/l of cupric sulfate and 0.1 mol/l of sodium thiosulfate of 60° C. for 60 minutes, washed with water and dried to obtain a greyish black foam. This foam had a volume resistivity of 17.8 Ω·cm. Then, the foam was immersed in an aqueous solution of 5% of ammonium polysulfide at 60° C. for 20 minutes, washed with water and dried to obtain a black foam. The latter foam had a volume resistivity of 2.72 Ω·cm.

EXAMPLE 4

A solution of 3.3% of powdery polyacrylonitrile in dimethylformamide was applied to a glass plate, from which a film of 5 μm in thickness was formed by a solvent evaporation process. This film was treated in an aqueous solution containing 0.05 mol/l of each of cupric sulfate and sodium thiosulfate at 60° C. for 90 minutes to obtain an electroconductive film having a volume resistivity of 0.58 Ω·cm. This film was further immersed in a toluene solution of 1% of sulfur and 1% of n-butylamine at 60° C. for 60 minutes, washed and dried to obtain an electroconductive film having a volume resistivity of 0.09 Ω·cm.

EXAMPLES 5 AND 6

To 100 parts by weight of polymer polyol containing 20% of acrylonitrile were added 4.4 parts by weight of water, 48.5 parts by weight of TDI-80 and given amounts of foam stabilizer and catalyst to form a foam with a density of 0.0250 g/cm$^3$, from which cell membranes were removed by an explosive process.

The resulting foam was immersed in an aqeuous solution containing 15% by weight of sodium hydroxide for 60 minutes, washed with water, dried and again immersed in a solution of 39.6 g of cuprous chloride and 8 g of hydrochloric acid in 1 l of water at 60° C. for 90 minutes (Example 5) or 120 minutes (Example 6). Thereafter, the foam was lightly washed with water, immersed in an aqueous solution of 5% by weight of ammonium polysulfide at 60° C. for 30 minutes, washed with water and dried. The thus obtained foam turned deep blackish green and had surface resistance ($\rho s$) and volume resistivity ($pv$) as shown in the following Table 3. As a result of the measurement of X-ray diffraction, diffraction peaks corresponding to CuS appeared at $2\theta$ of 29.2°, 31.7° and 47.8° in all samples. Moreover, the adhesion rate (% by weight) of CuS is shown in Table 3.

TABLE 3

| Example | Immersing time in CuCl$_2$ (min.) | Adhesion rate (wt. %) | $ps$ ($\Omega$) | $pv$ ($\Omega \cdot$ cm) |
| --- | --- | --- | --- | --- |
| 5 | 90 | 6.9 | $1.1 \times 10^2$ | $1.5 \times 10^2$ |
| 6 | 120 | 7.7 | 8.5 | $1.1 \times 10$ |

COMPARATIVE EXAMPLE 1

The same foam as used in Example 5 was immersed in an aqueous solution of 15% by weight of sodium hydroxide for 60 minutes, washed with water, dried and immersed in an aqueous solution containing 39.6 g/l of cuprous chloride, 8 g/l of hydrochloric acid and 5% by weight of ammonium polysulfide at 60° C. for 60 minutes. Then, the thus treated foam was washed with water and dried to obtain a foam having a substantially unchanged color, surface resistance and volume resistivity of not less than $10^7$ and no diffraction peak of CuS as measured from X-ray diffraction.

On the other hand, blackish green powder produced in the reaction liquid showed diffraction peaks corresponding to CuS as measured from X-ray diffraction.

It is understood from the above that CuS is produced by one-step process but does not adhere to the surface of the foam.

EXAMPLE 7

A flexible ether-series polyurethane foam with a size of 10 cm × 10 cm × 1 cm, whose cell membranes being removed by an explosive process, was immersed in an aqueous solution of 15% by weight of sodium hydroxide for 1 hour, washed with water, immersed in 500 cc of an aqueous solution of 0.10 mol/l of cupric sulfate at 60° C. for 60 minutes and then held in the same solution further containing 500 cc of an aqueous solution of 0.10 mol/l of sodium thiosulfate at 60° C. for 60 minutes. The thus treated foam was washed with water and dried to obtain a blackish brown foam having a volume resistivity of $7.6 \times 10^2$ $\Omega \cdot$cm.

Then, this foam was immersed in an aqueous solution of 5% by weight of ammonium polysulfide at 60° C. for 30 minutes, washed with water and dried to obtain a blackish green foam having a volume resistivity of $1.7 \times 10^2$ $\Omega \cdot$cm. This fact shows that the electroconductivity is improved by the sulfurization treatment.

As a result of the measurement on X-ray diffraction, the foam before the treatment with ammonium polysulfide showed diffraction peaks corresponding to Cu$_{1.8}$S at $2\theta$ of 46.3°, 32.1° and 27.7°, while the foam after the treatment with ammonium polysulfide showed diffraction peaks at $2\theta$ of 47.8°, 31.7° and 29.2°, which corresponded to CuS.

EXAMPLE 8

An open-cell, flexible ester series polyurethane foam was treated by the same procedure as described in Example 7.

As a result, the foam after the treatment with cupric sulfate and sodium thiosulfate was blackish brown and had a volume resistivity of not less than $10^7$ $\Omega \cdot$cm, while the foam after the treatment with ammonium polysulfide turned blackish green and had a volume resistivity of $2.4 \times 10^2$ $\Omega \cdot$cm. Further, the latter foam clearly showed diffraction peaks of CuS as measured from X-ray diffraction.

EXAMPLE 9

The same flexible ester series polyurethane foam as used in Example 8 was treated by the same procedure as described in Example 7, except that the foam was first immersed in an aqueous solution containing 0.10 mol/l of cupric sulfate and 0.10 mol/l of sodium thiosulfate while gradually warming from room temperature to 60° C. and holding at 60° C. for 60 minutes. The foam after the treatment with cupric sulfate and sodium thiosulfate was blackish brown and had a volume resistivity of not less than $10^7$ $\Omega \cdot$cm, while the foam after the treatment with ammonium polysulfide turned blackish green and had a volume resistivity of $9.6 \times 10$ $\Omega \cdot$cm.

EXAMPLE 10

A flexible polyurethane foam with a density of 0.028 g/cm$^3$ was prepared by adding 15 parts by weight of polyvinyl chloride to 100 parts by weight of polyol and then foaming it in the usual manner, from which a sample foam having a size of 10 cm × 10 cm × 1 cm was cut out. The sample foam was immersed in a solution of 25 g of cupric sulfate in 1,500 g of water at 60° C. for 60 minutes, and then a solution of 223 g of sodium thiosulfate in 500 g of water was added at 60° C., in which was further immersed the foam for 90 minutes. Thereafter, the foam was taken out from the solution, washed with water and dried to obtain a deep blackish green foam. In the latter foam, the increment of weight was 11.2% and the volume resistivity was as low as 1.19 $\Omega \cdot$cm. As a result of the measurement on X-ray diffraction, peaks corresponding to CuS appeared at $2\theta$ of 29.2°, 31.7° and 47.8° (X-ray used: CuK$\alpha$).

EXAMPLE 11

A flexible polyurethane foam having a density of 0.0200 g/cm$^3$ (hereinafter referred to as foam A) was prepared by adding 15 parts by weight of polyvinyl chloride to 100 parts by weight of polyol and then foaming in usual manner. This foam was immersed in a solution of 25 g of cupric sulfate and 199 g of sodium thiosulfate in 2,000 g of water, while gradually warming from room temperature to 60° C., for 150 minutes. After the immersion treatment, the foam A was washed with water and dried to obtain a deep blackish green foam A. The foam A had an increment of weight of 6.74% and a volume resistivity of $2.05 \times 10^{-2}$ $\Omega \cdot$cm and showed peaks corresponding to CuS as measured from X-ray diffraction.

Moreover, the electroconductive foam A was subjected to a burning test according to a method of MVSS No. 302. As a result, the burning rate was 87 mm/min, which showed that the polyvinyl chloride containing polyurethane foam after the sulfurization treatment is very excellent in the flame retardant property.

EXAMPLE 12

The same foam A as used in Example 11 was immersed in a solution of 125 g of cupric sulfate in 500 g of water at 60° C. for 60 minutes. Then, a solution of 122 g of sodium thiosulfate in 500 g of water was added to the above solution at 60° C., and the foam was further immersed therein for 90 minutes. Thereafter, the foam was washed with water and dried to obtain a blackish green foam having an adhesion rate (increment of weight) of 9.04% and a volume resistivity of 3.3 Ω·cm. Furthermore, the foam showed peaks corresponding to CuS as measured from X-ray diffraction.

EXAMPLE 13

The same foam A as used in Example 11 (size: 10 cm×10 cm×1 cm) was immersed in a solution of 79.2 g of cuprous chloride and 32 g of hydrochloric acid in 2,000 g of water at 60° C. for 120 minutes, lightly washed with water, dehydrated, immersed in an aqueous solution of 5% by weight of ammonium polysulfide at 60° C. for 30 minutes, washed with water, and dried to obtain a blackish green foam. This foam had an adhesion rate (increment of weight) of 10.1% and a volume resistivity of $7.3 \times 10^3$ Ω·cm and showed peaks corresponding to CuS as measured from X-ray diffraction.

As previously mentioned in detail, according to the invention, the cuprous compound adhered to the polar group-containing high polymeric substrate can directly be changed into cupric sulfide by sulfurization reaction with the solution of sulfur releasable substance. That is, according to the invention, the polymer substrate is immersed in an aqueous solution containing a bivalent copper compound and a reducing agent or an aqueous solution containing a monovalent copper compound and at the same time or subsequently treated in a solution of sulfur releasable substance, so that the electroconductive articles comprising cupric sulfide as an electroconductive layer can efficiently be produced in a high adhesion rate. Further, according to the invention, the number of treating steps can largely be reduced as compared with the prior art, and also the amount of the treating waste liquid can be made small, so that the invention has large merits in industry. Moreover, the electroconductive articles according to the invention have very excellent performances, so that they are very useful for wide applications.

What is claimed is:

1. An electroconductive article comprising a polar group-containing polyurethane foam, and an electroconductive layer of cupric sulfide formed therein, wherein said electroconductive article is produced by the process comprising immersing the polar group-containing polyurethane foam in an aqueous solution containing a bivalent copper compound and a reducing agent or an aqueous solution containing a monovalent copper compound, and at the same time or subsequently, treating the foam in a solution of a sulfur releasable substance.

2. The electroconductive article according to claim 1, wherein said polar group is selected from nitrile group, urethane group, urea group, amido group, hydroxyl group, ether group and ester group.

3. A method of producing an electroconductive article, comprising immersing a polar group-containing polyurethane foam in an aqueous solution containing a bivalent copper compound and a reducing agent or an aqueous solution containing a monovalent copper compound, and at the same time or subsequently, treating the foam in a solution of a sulfur releasable substance.

4. The method according to claim 3, wherein said polar group is selected from nitrile group, urethane group, urea group, amide group, hydroxyl group, ether group and ester group.

5. The method according to claim 3, wherein said monovalent copper compound is selected from cuprous chloride, cuprous iodide, cuprous cyanide and cuprous thiocyanate.

6. The method according to claim 3, wherein said bivalent copper compound is selected from cupric sulfate, cupric chloride, cupric nitrate, cupric acetate and cupric oxalate.

7. The method according to claim 3, wherein said reducing agent is selected from metallic copper, ferrous sulfate, sodium hypophosphite, hydroxylamine or a salt thereof, ammonium vanadate, furfural and glucose.

8. The method according to claim 3, wherein an amount of cuprous compound adhered to said polyurethane foam is not less than 1% by weight.

9. The method according to claim 3, wherein said sulfur releasable substance is selected from elemental sulfur, sodium thiosulfate, sodium sulfide, sodium hydrogensulfite, sulfurous acid, sodium dithionite, dithionous acid, ammonium sulfide, potassium sulfide, ammonium polysulfide, sodium polysulfide, potassium polysulfide, sulfur dioxide and hydrogen sulfide.

10. The method according to claim 3, wherein a concentration (by molar ratio) of sulfur in said solution of sulfur releasable substance is not more than 3 times the concentration of cuprous compound in the immersion solution.

11. The method of according to claim 3, wherein an amount of cupric sulfide adhered to said polyurethane foam is not less than 1% by weight.

12. The method according to claim 10, wherein said amount is 3 to 30% by weight.

* * * * *